(12) United States Patent
Strachan et al.

(10) Patent No.: US 8,188,897 B2
(45) Date of Patent: May 29, 2012

(54) ANALOG TO DIGITAL CONVERTER

(75) Inventors: John Paul Strachan, Millbrae, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 12/916,376

(22) Filed: Oct. 29, 2010

(65) Prior Publication Data
US 2012/0105263 A1    May 3, 2012

(51) Int. Cl.
*H03M 1/00* (2006.01)
(52) U.S. Cl. .................... 341/133; 341/155
(58) Field of Classification Search ............. 341/133, 341/155
See application file for complete search history.

(56) References Cited

U.S. PATENT DOCUMENTS

| | | | |
|---|---|---|---|
| 4,942,400 A * | 7/1990 | Tarzaiski et al. ............ 341/155 |
| 4,963,871 A * | 10/1990 | Shiga ........................... 341/133 |
| 6,653,704 B1 | 11/2003 | Gurney et al. |
| 6,717,193 B2 * | 4/2004 | Olewine et al. ............. 257/295 |
| 7,129,560 B2 | 10/2006 | Hamann et al. |
| 7,307,571 B2 | 12/2007 | Chen |
| 7,459,717 B2 | 12/2008 | Lung |
| 7,583,176 B1 | 9/2009 | Robinson |
| 7,728,321 B2 | 6/2010 | Hayakawa |
| 7,759,668 B2 | 7/2010 | Ahn |
| 2010/0155702 A1 * | 6/2010 | Wernersson ................ 257/24 |

FOREIGN PATENT DOCUMENTS

| WO | WO2009134291 | 11/2009 |
|---|---|---|
| WO | WO2010082922 | 7/2010 |
| WO | WO2010082929 | 7/2010 |

\* cited by examiner

*Primary Examiner* — Khai M Nguyen

(57) ABSTRACT

An analog to digital converter includes a dielectric substrate, an analog input wire, and digital output wires, with a metal insulator extending over the digital output wires. The analog input wire can be in proximity to the dielectric substrate and can generate heat when an electric current flows through the analog input wire. The digital output wires can also be in proximity to the dielectric substrate. The metal insulator can have a phase transition temperature above which the metal insulator is electrically conductive to short circuit at least one of the digital output wires in contact with a metal insulator portion above the phase transition temperature. The digital output wires can be arranged at predetermined distances from the analog input wire such that output wires have varying short circuit thresholds.

15 Claims, 6 Drawing Sheets

ANALOG TO DIGITAL CONVERTER

BACKGROUND

An analog-to-digital converter (ADC) is a device that converts an analog quantity into a discrete digital value. Typically, an ADC is an electronic device that converts an input analog voltage (or current) to a digital value proportional to the magnitude of the voltage or current.

A large number of ADCs have been proposed for converting analog signals into digital signals. Some example types of ADCs include a direct conversion, successive approximation, ramp-comparison, dual- or multi-slope, delta-encoding, pipeline, and time-interleaving ADCs.

Since a large number of ADCs exist the ADC implementations can vary in a number of ways. For example, the implementations can vary in differing usages of passive (e.g., resistors, capacitors) and active (e.g., diodes, transistors) elements. While existing ADCs have been successful in many applications, size, cost, manufacturing, and integration issues of the ADCs can be prohibitive in implementing ADC functionality in modern electronic devices and systems.

DETAILED DESCRIPTION

Figure 1:
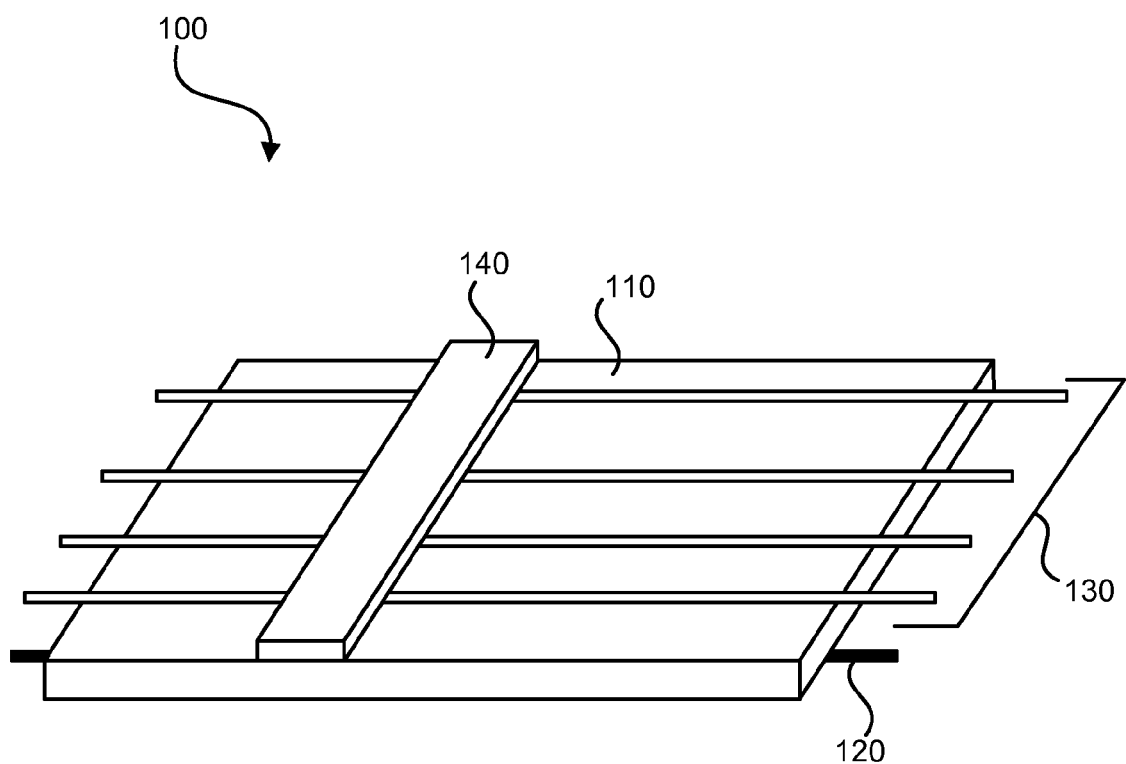
FIG. 1 is a perspective view of an analog to digital converter in accordance with an example.

Alterations and further modifications of the features illustrated herein, and additional applications of the principles of the technology as illustrated herein, which would occur to one skilled in the relevant art and having possession of this disclosure, are to be considered within the scope of the technology. The same reference numerals in different drawings represent the same element.

Analog to digital converters having nano-scale feature sizes provide easier manufacturing and direct integration with other computing components. There are current efforts to implement a hybrid integrated circuit chip with a bottom oxide layer or complementary metal-oxide-semiconductor (CMOS) layer, which may implement various logic and/or processing functions, with stacked oxide layers above the CMOS layer for providing additional processing and/or logic capabilities. For example, some of the processing and/or logic functions of the CMOS layer can be moved into a stacked oxide layer, or the stacked layer can include additional processing and/or logic functions in addition to the functionality provided by the CMOS layer. In one example, a stacked oxide layer may include computer memory or storage elements. Further, an analog to digital converter formed with very high density in another stacked oxide layer can be closer to the storage elements to improve parasitics and/or power usage of the device.

The present technology includes analog to digital conversion devices and methods. An example nano-scale analog to digital converter includes a dielectric substrate, an analog input wire, and digital output wires, with a metal insulator extending over the digital output wires. The analog input wire can be in proximity to the dielectric substrate and can generate heat when an electric current flows through the analog input wire. The digital output wires can also be in proximity to the dielectric substrate. For example, the analog and digital wires can be subposed or superposed to the substrate, with or without addition material between the analog and digital wires and the substrate. The analog and digital wires can also be supported by or attached to the substrate. The metal insulator can have a phase transition temperature above which the metal insulator is electrically conductive to short circuit at least one of the digital output wires in contact with the metal insulator portion above the phase transition temperature. The digital output wires can be arranged at predetermined distances from the analog input wire such that different output wires have different short circuit thresholds.

The description of the analog to digital converter as a nano-scale device can refer to the use of nano-scale feature sizes on the device. Thus, a device having nanowires can be a nano-scale device. The complete converter can have micron-scale dimensions or can be manufactured to sub-micron scale dimensions or even sub-nano-scale dimensions.

FIG. 1 illustrates an analog to digital conversion device 100. The analog to digital conversion device can include a substrate 110. The substrate may be comprised of any of a variety of types of materials capable of supporting a plurality of nanowires and of conducting heat. For example, the substrate may include a dielectric material. In more specific embodiments, the substrate may comprise a material including silicon dioxide ($SiO_2$), titanium dioxide ($TiO_2$), tantalum pentoxide ($Ta_2O_5$), hafnium dioxide ($HfO_2$), tungsten dioxide ($WO_2$), or combinations thereof. Such dielectric materials can provide desirable dielectric constants as well as CMOS fabrication compatibility.

Wires 120, 130 can be formed on the substrate 110. For example, a wire can be made by depositing a metal or other appropriate material onto the substrate to form an electrode or wire. The wire may be deposited by conventional techniques including photolithography, electron beam lithography, or by more advanced techniques such as imprint lithography. The electrodes that are included in the device may comprise any suitable conductive material, including but not limited to gold, platinum, tungsten, or copper.

A metal insulator 140 may be deposited to be in contact with a plurality of the wires. The metal insulator serves as a general region of the device in which modifiable resistance characteristics are exhibited, and therefore comprises a transition material that is suited to provide such functionality. In particular, the bulk of the metal insulator material can comprise a material that is electronically semiconducting or nominally electronically insulative. The metal insulator can include materials known to be suitable as a dielectric in semiconductor devices. Non-limiting examples include oxides, sulfides, selenides, nitrides, phosphides, arsenides, chlorides, and bromides of silicon, transition metals, rare earth metals, or alkaline earth metals. In a particular embodiment, the metal insulator material includes a metal oxide. Non-limiting examples of such materials are titania, hafnia, zirconia, strontia, and alumina. The metal insulator can be an oxide which shows metal-insulator transitions, such as vanadium oxide (VO), vanadium trioxide ($V_2O_3$), or vanadium dioxide ($VO_2$), with or without light chromium (Cr) doping. Titanium trioxide ($Ti_2O_3$), and the Magneli phases $Ti_nO_{2n-1}$, with n>2 (particularly including $Ti_4O_7$) are also suitable metal insulators. Various manganites, such as $La_xPr_yCa_zMnO_3$, perovskites, and cuprates can also be used as suitable metal insulators. In a more particular embodiment, the metal insulator material comprises vanadium dioxide.

In a more particular example, a thin metal insulator layer of a temperature-responsive transition material is incorporated in an analog to digital converter device in contact with the substrate and the digital output wires. The term "temperature-responsive transition material" as used here refers to materials that experience a substantial and reproducible change in conductivity as a function of temperature. More specifically, such materials undergo a transition from an insulative material to a conductive material at a particular temperature. In some materials this change in electrical property is accompanied by a change in optical properties of the material. Examples of such materials include vanadium dioxide. Other materials may exhibit temperature-driven optical changes, but to the extent any of these other materials exhibit changes in conductivity, then such materials may be used in accordance with the examples discussed herein. These include oxides of manganese, molybdenum, titanium, and iron. A number of composites of these elements have also been found to exhibit temperature-responsive phase changes, and may further include elements such as cadmium, mercury, tellurium, and selenium. In a particular embodiment, the temperature-responsive transition material used is vanadium dioxide ($VO_2$). Vanadium dioxide undergoes an abrupt change from a transparent semiconductive phase to a reflective conductive phase upon heating to about 68° C. This phase transition temperature can be tuned up or down by changing the ratio of V and O or adding impurities to the vanadium dioxide.

Suitable deposition techniques for depositing the metal insulator or phase transition material include conventional physical and chemical techniques, including evaporation from a Knudsen cell, electron beam from a crucible, sputtering from a target, electron beam evaporation, chemical vapor deposition (CVD), metal-organic chemical vapor deposition (MOCVD), molecular beam epitaxy, atomic layer deposition, or other forms of chemical vapor or beam growth from reactive precursors. The metal insulator material may be deposited as a thin film from 1 to 100 nanometers thick.

Of the wires on the substrate, at least one wire may comprise an analog input nanowire 120 and a plurality of other wires may comprise digital output nanowires 130. In the example shown in FIG. 1, the analog input nanowire is on a side of the substrate opposite from the digital output nanowires. The analog input nanowire can act as a heating source. The digital output nanowires can be in contact with a metal insulator material 140 such as vanadium oxide and can have a voltage applied thereto. For example, the digital output nanowires can be held high at a predetermined $V_{DD}$ voltage value. A current through the analog input nanowire can cause the analog input nanowire to emit heat. The substrate 110 can conduct the heat to the vanadium oxide material 140. The vanadium oxide material can break the connection of a digital output nanowire and close a circuit from the digital output nanowire to ground when the vanadium oxide is heated above a phase transition temperature at a location where the vanadium oxide contacts the digital output nanowire. In other words, when the heat from the analog input nanowire is sufficient to cause a transition in the metal insulator material in a region contacting a digital output nanowire, the metal insulator can short the circuit. The device can register a voltage drop at the short-circuited digital output nanowire.

The transition of the vanadium oxide material 140 from the analog input nanowire 120 can act as a threshold measurement of the analog input. Each digital output nanowire can have a different short-circuiting threshold due to a geometrical distance from the analog input. For example, a digital output nanowire closest to the analog input can be designated as a most significant bit and a digital output nanowire farthest from the analog input can be designated as a least significant bit. Digital output nanowires closer to the analog input will register a voltage drop sooner with respect to the analog input than digital output nanowires farther away from the analog input. In one aspect, the number of digital output nanowires exhibiting a voltage drop can be indicative of the level of analog current through the analog input nanowire.

A geometrical arrangement of digital output nanowires can be selected such that power law falloff of heating $R^{-k}$ is accounted for, where R is the distance from the analog input nanowire. The geometrical arrangement of digital output nanowires can be such that the digital representation of the analog input signal for each neighboring bit may be exponentially more sensitive than a neighboring bit. For example, a separation of the digital output nanowires can be exponentially increased. Thus, a digital output nanowire can be exponentially more sensitive than the next closest nanowire to the analog input.

The illustrated analog to digital conversion device can be a stacked oxide layer above a CMOS layer, oxide layer, or other type of layer in a computer chip.

Figure 2:
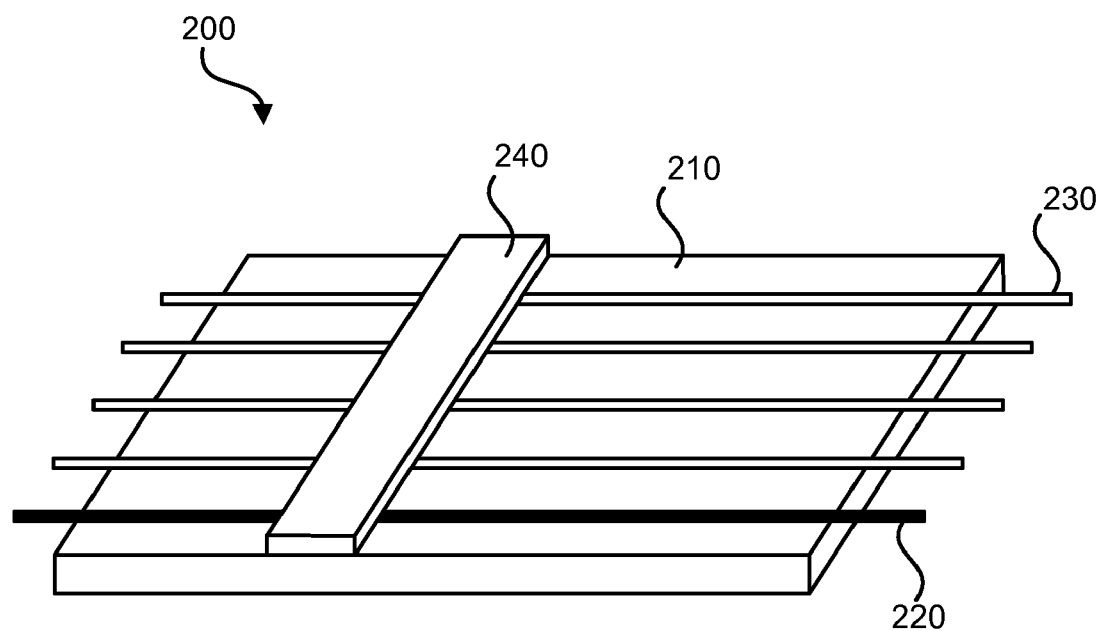
FIG. 2 is a perspective view of an analog to digital converter having a metal insulator in contact with input and output wires in accordance with an example.

Referring to FIG. 2, an analog to digital converter (ADC) 200 is shown. The
ADC includes a substrate 210, an analog input wire 220, digital output wires 230, and a metal insulator material 240. In this example, the converter includes the analog and digital wires on a same side of the substrate. In this example, the metal insulator material extends over both the digital output nanowires as well as the analog input nanowire. In this configuration, heat from the analog input can be applied directly to the metal insulator material rather than being conducted through the substrate. (However, heat may also be conducted through the substrate.) Direct contact with the heat source can affect the temperatures at which the metal insulator material transitions, and thus can affect the thresholds of the digital outputs. Accordingly, distances between wires, metal insulator materials, and so forth can be selected to enable digital conversion from the analog input.

Figure 3:
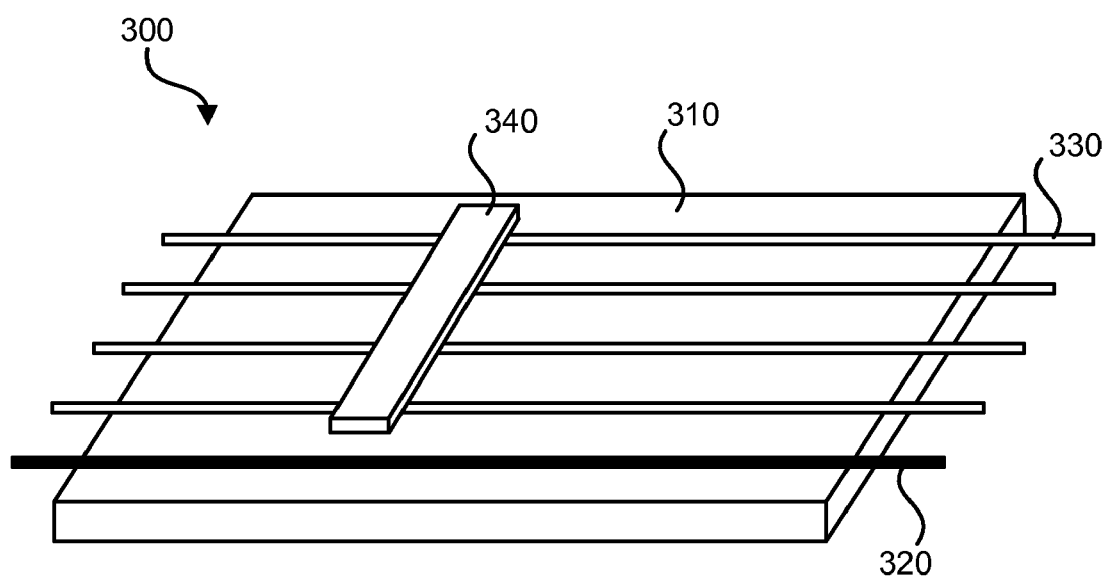
FIG. 3 is a perspective view of an analog to digital converter having input and output wires on a same side of a substrate in accordance with an example.

Referring to FIG. 3, an ADC 300 is shown which includes a substrate 310, an analog input wire 320, digital output wires 330, and a metal insulator material 340. In this example the converter includes the analog and digital wires on a same side of the substrate. Also, the metal insulator material extends over the digital output nanowires but not the analog input nanowire. As a result, the metal insulator material will not transition from direct contact with the heat source as in FIG. 2, but can be transitioned by heat conducted through the substrate.

Figure 4:
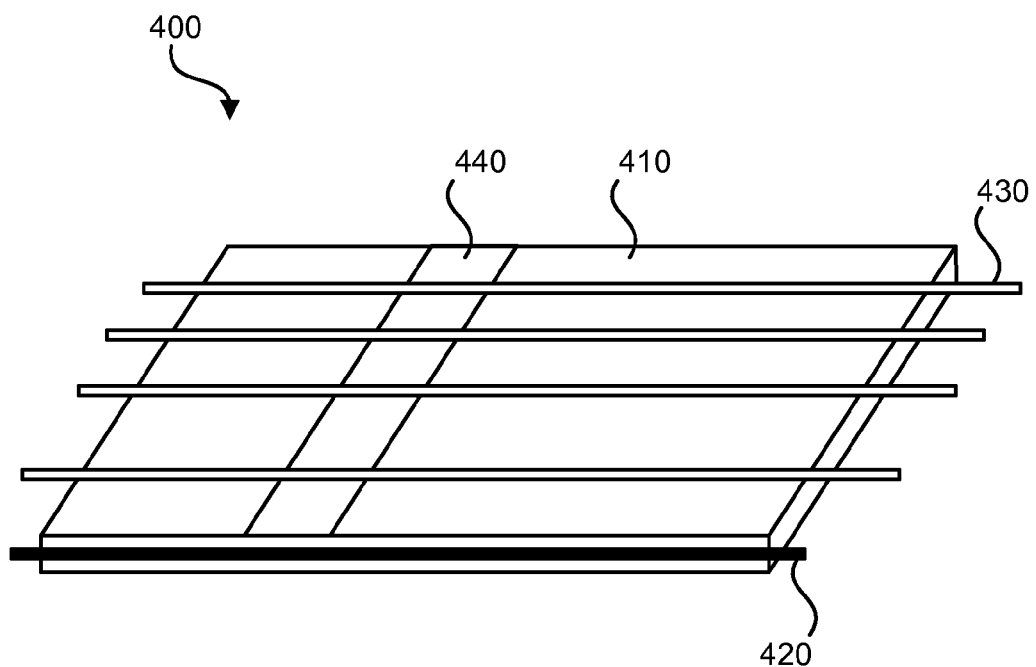
FIG. 4 is a perspective view of an analog to digital converter having an input wire on a side of a substrate orthogonal to a side of the substrate on which output wires are formed in accordance with an example.

Referring to FIG. 4, an ADC 400 is shown which includes a substrate 410, an analog input wire 420, digital output wires 430, and a metal insulator material 440. In this example, the analog wire is on a side of the substrate orthogonal to the side on which the digital output wires are formed. Also, the digital output wires are formed on top of the metal insulator material. As in FIG. 3, the metal insulator material can be transitioned by heat conducted through the substrate. The metal insulator material can be inset into the substrate or formed on top of the substrate. The digital output wires can thus either be flush with a top of the substrate (when the metal insulator material is inset into the substrate), or can be raised at a bridge section where the digital output wires cross the metal insulator material.

While the configuration of FIG. 4, as well as that of the other figures, is illustrated as a perspective view of a planar and horizontally oriented layer which may be stacked on a CMOS chip, other shapes and configurations are also contemplated. For example, the ADC 400 of FIG. 4 may comprise a layer which is oriented perpendicularly (or at some other orientation) with respect to a bottom CMOS layer. The heat source may be on an end of the layer closer to the bottom layer or nearer an end of the layer farther from the bottom layer.

Figure 5:
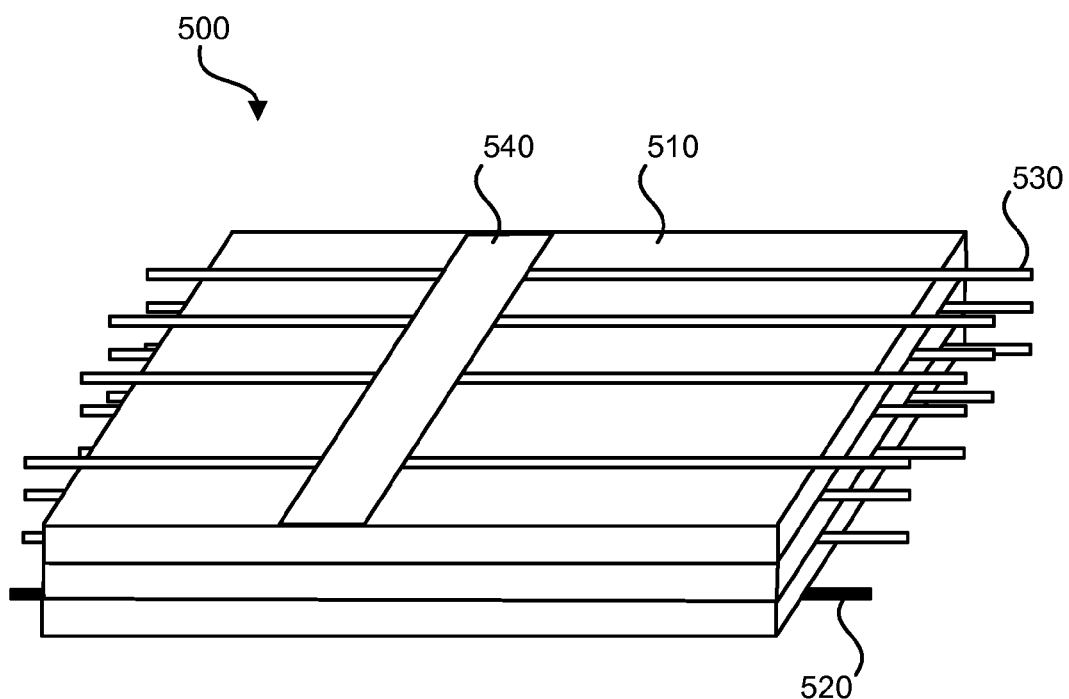
FIG. 5 is a perspective view of a multi-layer analog to digital converter having a single input wire in accordance with an example.

Referring to FIG. 5, an ADC 500 is shown which includes a plurality of adjacent layers. As in other configurations, the ADC includes a substrate 510, an analog input wire 520, digital output wires 530, and a metal insulator material 540. Whereas previously described configurations included one analog input nanowire for one layer and/or set of digital output nanowires, the ADC of FIG. 5 includes a single analog input nanowire for providing an analog input which can be detected or measured by the digital output wires in multiple layers. Heat from the analog input can be conducted from one substrate to another adjacent substrate. Each layer can include a metal insulator material for transitioning and closing the circuit to a digital output wire or set of digital output wires. Though the example shown includes multiple digital output wires at each layer, an alternate configuration includes a single digital output wire at each layer. A number of digital output wires at any particular layer can be varied to provide a desired sensitivity to the analog signal and can be based at least in part on a desired spacing from the analog input. Thus, different layers can have different numbers of digital outputs.

The ADC 500 can include layers or arrangements of digital outputs which may or may not be in discrete physical layers defined by separate substrates. For example, the plurality of digital output nanowires can be arranged three dimensionally with respect to the analog input nanowire at the different predetermined distances within a single substrate. A metal insulator material can also be within the substrate and in contact with the digital output wires to provide the transitioning and circuiting for the analog to digital conversion. As with two dimensional spacing of digital output wires, three dimensional spacing of digital output wires can affect the sensitivity of the ADC.

More heat (and thus greater input signal) can result in a digital output at further digital output wire from the analog input.

Figure 6:
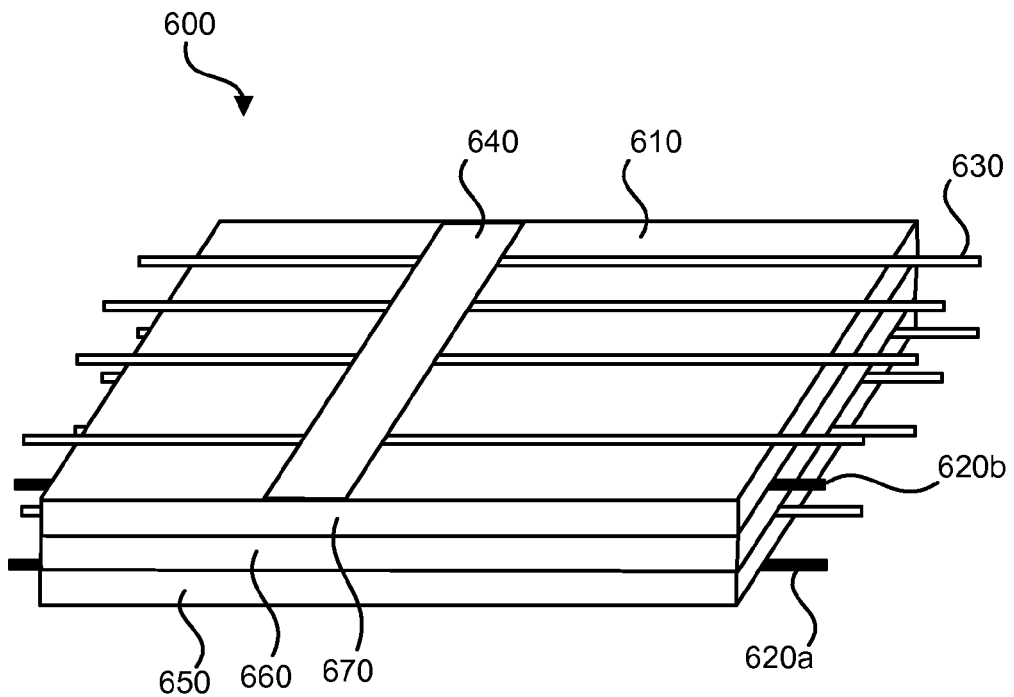
FIG. 6 is a perspective view of a multi-layer analog to digital converter having multiple input wires in accordance with an example.

Referring to FIG. 6, an ADC 600 is shown which also includes a plurality of adjacent layers. The ADC includes a substrate 610, a plurality of analog input wires 620a-b, digital output wires 630, and a metal insulator material 640. The converter also includes a barrier layer 660 which is formed from a thermally insulative material such that heat from one analog input is not conducted to the metal insulator of an unassociated layer. In other words, the barrier layer can prevent heat from the analog input wire 620a of layer 650 from being conducted to layer 670. Any desired number of layers can be stacked on top of one another and can operate separately and independently of the other layers because of the insulative barrier separating the layers.

Figure 7:
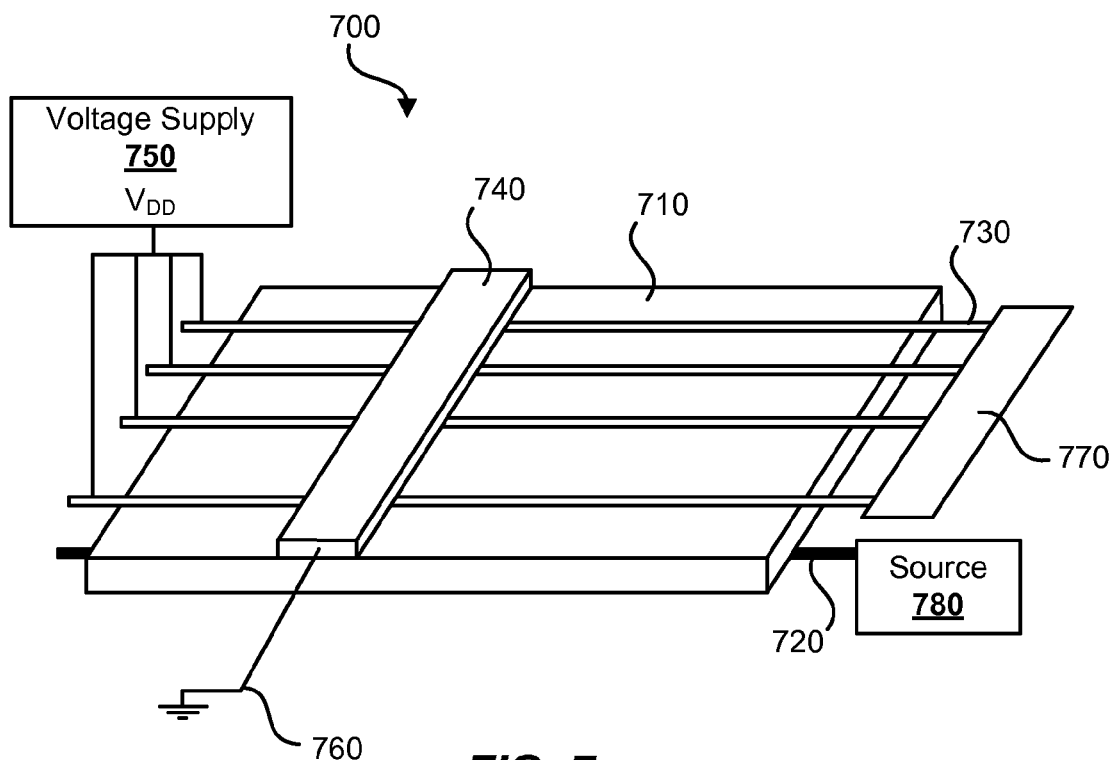
FIG. 7 is a perspective view of circuitry associated with an analog to digital converter in accordance with an example.

Referring to FIG. 7, an ADC 700 is shown which is electrically coupled to circuitry to enable analog to digital conversion. The analog input wire 720 is electrically coupled to an analog input source 780. The digital output wires 730 are coupled to a voltage supply 750 for maintaining a predetermined voltage across the digital output wires. In one aspect, each of the digital output wires can be separately coupled to the voltage supply. The metal insulator material 740 is coupled to an electrical ground 760. In other aspects, the metal insulator material can be coupled to a voltage which is less than the voltage $V_{DD}$ at the voltage supply such that there will be a voltage drop when the metal insulator material transitions at a digital output wire. A digital output wire can be coupled to a detector circuit 770 for detecting a drop in voltage when the metal insulator material in contact with the digital output wire transitions and shorts the circuit. The detector circuit can provide a signal, such as a binary signal, indicating the voltage drop at a digital output. The signal can be representative of the original analog input.

Figure 8:
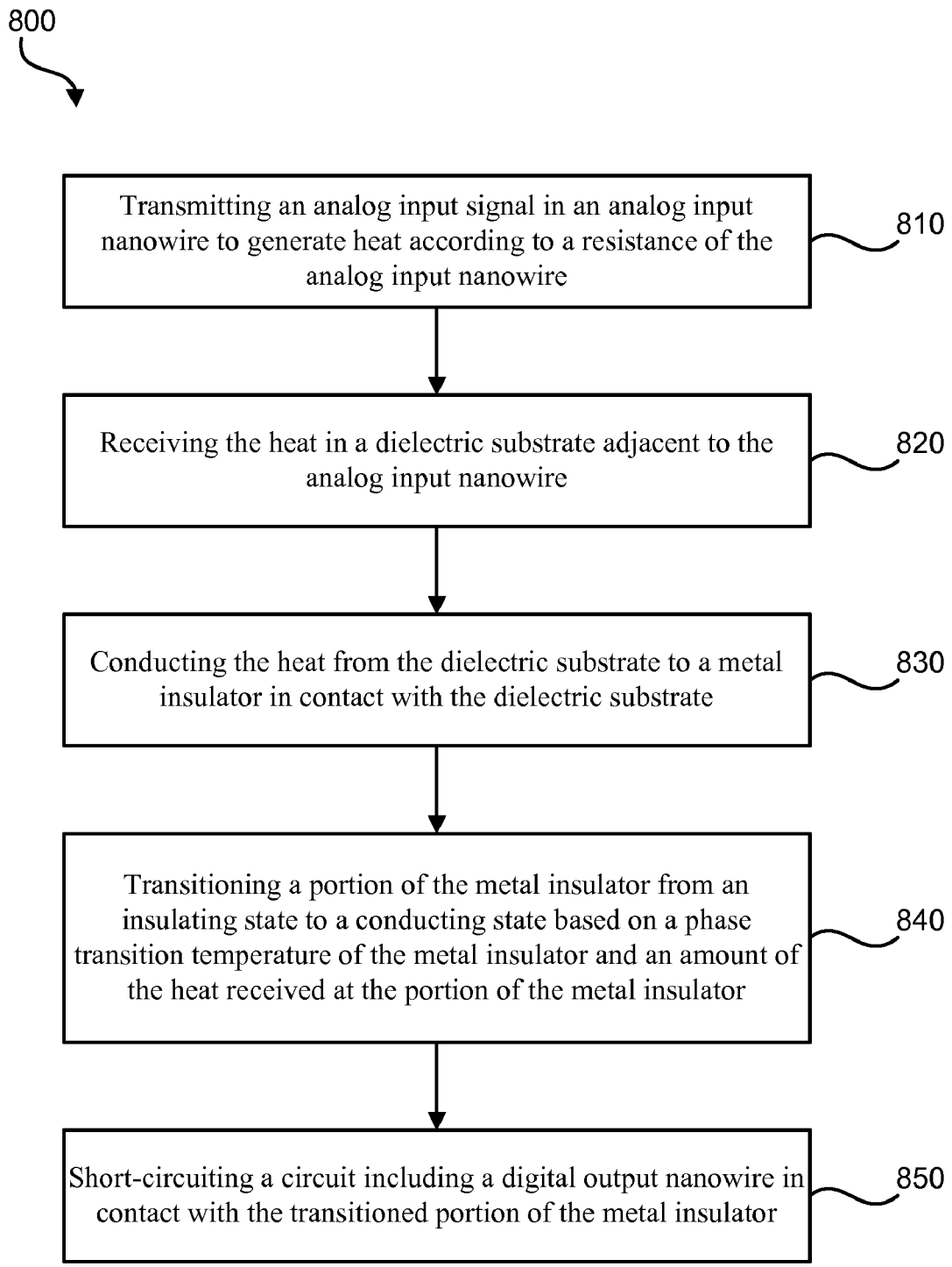
FIG. 8 is a flow diagram of a method for converting an analog signal to a digital signal in accordance with an example.

Referring to FIG. 8, a method 800 is shown for nano-scale analog to digital conversion. The method includes transmitting 810 an analog input signal in an analog input nanowire to generate heat according to a resistance of the analog input nanowire. Resistance of the analog input nanowire can be selected based on an application of the ADC, the metal insulator material being used, the thermal conductivity of the substrate, and/or desired spacing of the digital output wires from other digital output wires or the analog input wire.

The heat from the analog input nanowire can be received 820 in a dielectric substrate adjacent to the analog input nanowire. The heat can be conducted 830 from the dielectric substrate to a metal insulator in contact with the dielectric substrate. As described above, the type of dielectric material used as the substrate can affect the thermal conductivity from the analog input nanowire to the metal insulator. Thus, varying certain variables can affect various aspects of the converter, such as spacing of the wires, type of metal insulator material used, sensitivity of the converter, thickness of the substrate, and so forth.

The dielectric substrate may comprise a piezo-electric substrate. Strain or pressure on the piezo-electric substrate can affect the thermal conductivity of the substrate, and can thus affect the transitioning of the metal insulator material. In one aspect, the pressure or strain on the substrate can be varied in time to provide varied sensitivity and performance to an analog input signal. In other words, the method may further comprise applying strain or pressure to the piezoelectric dielectric substrate to change a thermal conductivity of the piezoelectric dielectric substrate.

A portion of the metal insulator can be transitioned 840 from an insulating state to a conducting state based on a phase transition temperature of the metal insulator and an amount of the heat received at the portion of the metal insulator. The transition temperature of the metal insulator material used can vary. For example, vanadium dioxide ($VO_2$) can be useful in warmer applications than titanium dioxide ($TiO_2$). More specifically, $VO_2$ can be used in applications at or above room temperature in an example. Because the transition temperature of $TiO_2$ is significantly lower than the transition temperature of $VO_2$, then $TiO_2$ may be used in applications at or around 150 Kelvin in an example.

The method 800 can also include short-circuiting 850 a digital output nanowire in contact with the transitioned portion of the metal insulator. The method can include holding the digital output nanowire to a predetermined voltage level and detecting the short-circuiting when the predetermined voltage level drops, or holding the metal insulator to a predetermined voltage level and detecting the short-circuiting when the predetermined voltage level drops.

As described above, the method can include holding the digital output lines high (i.e., at a predetermined voltage $V_{DD}$) and providing a lower voltage level or ground in contact with the metal insulator to cause a voltage drop across a digital output line when the metal insulator material in contact with the digital output line transitions.

As an alternative, the metal insulator material can be held high and the digital output lines held low, such that a current increase is registered when the metal insulator material transitions.

In an array of digital output nanowires, each of the digital output nanowires can be used to represent bits of data. For example, in the simplest case, an output wire may have two states: a high state and a low state. The high state may represent a binary "1" and the low state may represent a binary "0" or vice versa. Thus binary data can be written into an array by changing the state of the output wires. The data can then be retrieved by determining the state of the output wires.

The analog input signal can be a first analog input signal and the heat from the first analog input signal can be a first heat or first temperature. The method can further include transmitting a second analog input signal after the first analog input signal to generate a second heat or second temperature differing from the first temperature according to a difference between the first analog input signal and the second analog input signal. In this example, portions of the metal insulator transitioned from the first temperature can differ from portions of the metal insulator transitioned by the second temperature according to a difference in the first temperature and the second temperature. Because the size and scale of the substrate, wires, etc. is small, heating and cooling can be rapid. For example, depending on the thermal conductivity of the substrate, proximity of the metal insulator material to the analog input, and so forth, the metal insulator material can be transitioned from an insulating material to an electrically conductive material in as little as 1 nanosecond or less. Likewise, the metal insulator material can be transitioned back from the electrically conductivity to electrical insulation in a similarly short time. Thus, the converter can be used with even rapidly changing analog input signals to provide an accurate and responsive digital output signal.

Figure 9:
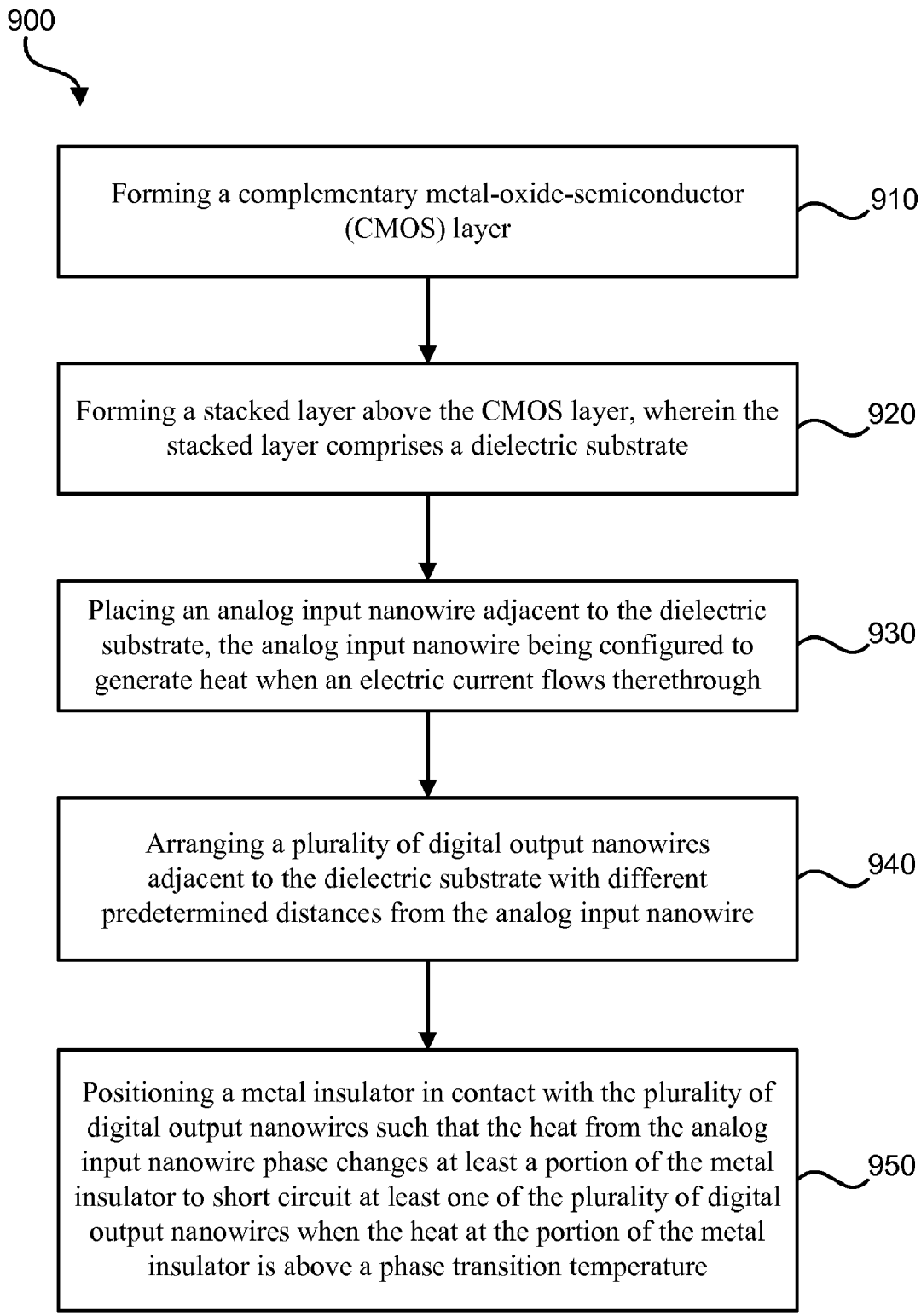
FIG. 9 is a flow diagram of a method for forming an analog to digital converter in accordance with an example.

Referring to FIG. 9, a method 900 is shown for forming an analog to digital converter. The method includes forming 910 a complementary metal-oxide-semiconductor (CMOS) layer. A stacked layer can be formed 920 above the CMOS layer (the stacked layer can include a dielectric substrate). An analog input nanowire can be placed 930 adjacent to the dielectric substrate. The analog input nanowire can be configured to generate heat when an electric current flows through the analog input nanowire. A plurality of digital output nanowires can be arranged adjacent to the dielectric substrate with different predetermined distances from the analog input nanowire. A metal insulator can be positioned 950 in contact with the plurality of digital output nanowires such that the heat from the analog input nanowire phase changes at least a portion of the metal insulator to short circuit at least one of the plurality of digital output nanowires when the heat at the portion of the metal insulator is above a phase transition temperature.

The method can include varying a resistance of the analog input nanowire to provide a predetermined amount of heat based on different electric currents. The method can also include varying the predetermined distances of the plurality of digital output nanowires from the analog input nanowire to vary a sensitivity of the analog to digital converter to the heat. The method can also include varying a material of the metal insulator to adjust the phase transition temperature for short circuiting the at least one of the plurality of digital output nanowires. The method can also include varying a material of the dielectric substrate to change a thermal conductivity of the dielectric substrate.

In forming the digital and analog nanowires, the wires can be formed at any orientation along the substrate or at any position on or within the substrate. For example, although the figures illustrate wires running in straight lines squared with the edges of the substrate, the wires can be curved or follow skewed paths. Although the wires are illustrated as parallel, the wires can also be diverging, converging, or have any other desirable pattern. In one aspect, the digital and analog wires can be parallel. In another aspect, the digital wires can be parallel and the analog wire can be at an angle with respect to the digital wires. In similar fashion, though the metal insulator material is illustrated as being oriented perpendicularly to the digital and analog wires, the metal insulator can be oriented in any suitable desired direction with respect to the digital and/or analog wires. In another aspect, the analog input nanowire can be positioned at any suitable position with respect to the digital output nanowires, rather than being positioned on one end of an array. For example, digital output nanowires can be spaced at predetermined distances on either side of the analog nanowire in a two dimensional implementation. In a three dimensional implementation the digital output nanowires could be arranged in configurations including nanowires above, below, and to both sides of the analog nanowire. In each of these various configurations, being able to determine a level of analog input is sufficient for conversion. Thus, the precise orientations, spacings, thicknesses, etc. of the various components of a converter can be varied as desired or to suit specific applications.

In heating the substrate, the long range fall-off of the heating is proportional to 1/R, where R is the distance from the analog input or heat source. In the digital signal, the significance of the most significant bit as compared to the least significant bit is an exponential difference. For example, the significance of a particular bit is proportional to $2^n$. The spacing of wires and types of materials used for the various components of the converter can thus be selected to match the exponential significance of the digital output bits with the not as significant thermal fall-off from the heat source.

Although individual nanowires, metal insulators, substrates, etc. are shown with rectangular shapes, the nanowires, metal insulators, substrates, etc. can also have square, circular, elliptical, or more complex shapes and/or cross sections. The nanowires, metal insulators, substrates, etc. may also have many different widths or diameters and aspect ratios or eccentricities.

The AD converter layer(s) may be fabricated using a variety of techniques including conventional photolithography as well as mechanical nanoimprinting techniques. Alternatively, nanowires can be chemically synthesized and can be deposited as layers of approximately parallel nanowires in a processing step (or steps), including Langmuir-Blodgett processes. Other alternative techniques for fabricating nanowires may also be employed, such as interference lithography. Many different types of conductive and semiconductive nanowires can be chemically synthesized from metallic and semiconductor substances, from combinations of these types of substances, and from other types of substances.

The analog to digital converter described can be integrated directly with CMOS devices and/or CMOS fabrication techniques. For example, the analog to digital converter can be formed on top of a CMOS layer, oxide layer, or other type of layer in an electronic chip using CMOS fabrication techniques. More specifically, the converter can be manufactured in nano-scale, high density implementations with other devices in CMOS layers. The converter can bring input processing from a lower CMOS level up to a stacked level. Many oxides (e.g., vanadium oxide, titanium oxide, etc.) show metal-insulator phase transitions and can be used for the analog to digital conversion. These transitions can be above room temperature (60 C. for $VO_2$) and can be engineered with doping and mixing of different transition metal oxides. The converter can be manufactured at a low cost. Also, the operation of the device can be rapid. At the nano-scale, the surface to volume ratio is much higher than bulk materials and thus heating and cooling is much faster than with larger scale implementations.

The analog to digital converter includes a number of different variables for providing different performance, responsiveness, sensitivity and other characteristics.

The variables can be configured to suit a specific application. Some of the variables described include the following:
  the resistance of the analog input wire can be varied to change the amount of heat generated by an input signal;
  the distance of digital output wires from the analog input wire can be varied to define a sensitivity of the converter to different analog inputs;
  the distance between digital output wires can be varied to vary the sensitivity of the converter to different analog inputs;
  the material or composition used as the metal insulator can be varied to adjust a temperature at which the transition occurs;
  the dielectric material can be varied to change a thermal conductivity to the heat from the analog input; and
  strain or pressure on the dielectric material can be varied to provide a desired thermal conductivity when the dielectric material is a piezo-electric material.

These variables can provide various "knobs" or control features for fine-tuning or adjusting performance of the converter. As used herein, micron-scale dimensions refer to dimensions that range from 1 micrometer to a few micrometers in size. Nanometer scale (or nano-scale) dimensions refer to dimensions that range from 0.1 nanometers to 50 nanometers (0.05 micrometers). Nanowires or nano-scale wires typically refer to rod or ribbon-shaped conductors or semiconductors with widths, heights or diameters having dimensions of 0.1 to 50 nanometers, and lengths that can measure from a few nanometers to several micrometers or longer. However, the technology described herein may also be implemented at larger or smaller dimensions. Thus, the wires may be picoscale or femtoscale wires, for example.

While the forgoing examples are illustrative of the principles of the present technology in particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. An analog to digital converter, comprising:
   a dielectric substrate;
   an analog input wire in proximity to the dielectric substrate and configured to generate heat when an electric current flows through the analog input wire;
   a plurality of digital output wires in proximity to the dielectric substrate; and
   a metal insulator extending across the plurality of digital output wires, the metal insulator having a phase transition temperature above which the metal insulator is electrically conductive to short circuit at least one of the plurality of digital output wires in contact with a metal insulator portion above the phase transition temperature;
   wherein the plurality of digital output wires is arranged at predetermined distances from the analog input wire such that wires of the plurality of digital output wires comprise varying short circuit thresholds.

2. The digital converter as in claim 1, wherein the analog input wire and the plurality of digital output wires are on opposite sides of the dielectric substrate.

3. The digital converter as in claim 1, wherein the analog input wire and the plurality of digital output wires are on a same side of the dielectric substrate.

4. The digital converter as in claim 3, wherein the metal insulator extends across the plurality of digital output wires and the analog input wire in a direction substantially perpendicular to the plurality of digital output wires and the analog input wire.

5. The digital converter as in claim 1, wherein the dielectric substrate comprises a piezoelectric dielectric substrate, wherein strain or pressure on the piezoelectric dielectric substrate changes a thermal conductivity of the piezoelectric dielectric substrate.

6. The digital converter as in claim 1, wherein the plurality of digital output wires are arranged three dimensionally with respect to the analog input wire at the different predetermined distances.

7. A method for forming an analog to digital converter, comprising:
   forming a base layer;
   forming a stacked layer above the base layer, wherein the stacked layer comprises a dielectric substrate;
   placing an analog input nanowire adjacent to the dielectric substrate, the analog input nanowire being configured to generate heat when an electric current flows through the analog input nanowire;
   arranging a plurality of digital output nanowires adjacent to the dielectric substrate with varying predetermined distances from the analog input nanowire; and
   positioning a metal insulator in contact with the plurality of digital output nanowires such that heat from the analog input nanowire phase changes at least a portion of the metal insulator to short circuit at least one of the plurality of digital output nanowires when the heat at the portion of the metal insulator is above a phase transition temperature.

8. A method as in claim 7, further comprising varying a resistance of the analog input nanowire to provide a predetermined amount of heat based on different electric currents.

9. A method as in claim 7, further comprising varying the predetermined distances of the plurality of digital output nanowires from the analog input nanowire to vary a sensitivity of the analog to digital converter to the heat.

10. A method as in claim 7, further comprising varying a material of the metal insulator to adjust the phase transition temperature for short circuiting the at least one of the plurality of digital output nanowires.

11. A method as in claim 7, further comprising varying a material of the dielectric substrate to change a thermal conductivity of the dielectric substrate.

12. A method for nano-scale analog to digital conversion, comprising:

transmitting an analog input signal via an analog input nanowire to generate heat according to a resistance of the analog input nanowire;

receiving the heat in a dielectric substrate adjacent to the analog input nanowire;

conducting the heat from the dielectric substrate to a metal insulator in contact with the dielectric substrate;

transitioning a portion of the metal insulator from an insulating state to a conducting state based on an amount of the heat received at the portion of the metal insulator; and short-circuiting a digital output nanowire in contact with the transitioned portion of the metal insulator.

13. The method as in claim 12, wherein the dielectric substrate comprises a piezoelectric dielectric substrate, the method further comprising applying strain or pressure to the piezoelectric dielectric substrate to change a thermal conductivity of the piezoelectric dielectric substrate.

14. The method as in claim 12, wherein the analog input signal comprises a first analog input signal, the heat comprises a first heat, and the method further comprises transmitting a second analog input signal after the first analog input signal to generate a second heat differing from the first heat according to a difference between the first analog input signal and the second analog input signal.

15. The method as in claim 14, wherein portions of the metal insulator transitioned from the first heat differ from portions of the metal insulator transitioned by the second heat according to a difference in the first heat and the second heat.

* * * * *